United States Patent [19]
Chiu

[11] Patent Number: 5,977,610
[45] Date of Patent: Nov. 2, 1999

[54] INTEGRATED CIRCUIT HAVING RESISTOR FORMED OVER MULTIPLE TUBS OF SEMICONDUCTOR MATERIAL

[75] Inventor: Hon Kin Chiu, Hayward, Calif.

[73] Assignee: National Semniconductor Corporation, Santa Clara, Calif.

[21] Appl. No.: 09/176,733

[22] Filed: Oct. 21, 1998

[51] Int. Cl.$^6$ ............................................. H01L 29/8605
[52] U.S. Cl. ........................... 257/538; 257/532; 438/384
[58] Field of Search .................................. 257/538, 537, 257/536, 532–535; 438/382, 383, 384, 385

[56] References Cited

U.S. PATENT DOCUMENTS

| | | | |
|---|---|---|---|
| 3,644,850 | 2/1972 | Ho ............................................. | 257/533 |
| 4,710,791 | 12/1987 | Shirato et al. ............................ | 257/533 |
| 5,525,831 | 6/1996 | Ohkawa et al. .......................... | 257/536 |
| 5,565,367 | 10/1996 | Lee .......................................... | 438/382 |
| 5,661,324 | 8/1997 | Fournel et al. .......................... | 257/379 |
| 5,661,332 | 8/1997 | Nakamura et al. ...................... | 257/536 |
| 5,670,819 | 9/1997 | Yamaguchi .............................. | 257/536 |
| 5,815,051 | 9/1998 | Hamasaki et al. ...................... | 257/533 |
| 5,895,960 | 4/1999 | Fritz et al. ............................... | 257/536 |

*Primary Examiner*—David B. Hardy
*Attorney, Agent, or Firm*—Limbach & Limbach L.L.P.

[57] ABSTRACT

An integrated circuit, including a resistor having multiple, series-connected resistor segments formed over multiple tubs of semiconductor material of a first polarity in a semiconductor substrate of the opposite polarity. The resistor is implemented with multiple bootstrapping in the sense that all tubs are coupled to a node of the circuit whose potential changes, in response to a changing input signal, in a direction so as to pull the potential at one end of the resistor in a desired direction. Each resistor segment can be formed over a different one of the tubs, or there are more segments than tubs (e.g., more than one segment formed over one of the tubs or at least one segment having no tub under it). In preferred embodiments, the circuit is a high-speed cascode amplifier (or other amplifier), the resistor is a gain-setting resistor coupled to the top rail, and the tubs are coupled to the amplifier's output. Implementing the resistor in accordance with the invention results in faster amplifier response (to a rapidly changing input) and (if the resistor has a field oxide layer between the resistor segments and the underlying semiconductor material) reduced dependence of the response time on the field oxide layer thickness. In a preferred embodiment, the resistor comprises ten segments of polysilicon connected in series over three tubs of N-type semiconductor material in a P-type semiconductor substrate (with a field oxide layer separating each tub from the segment or segments overlying it).

25 Claims, 11 Drawing Sheets

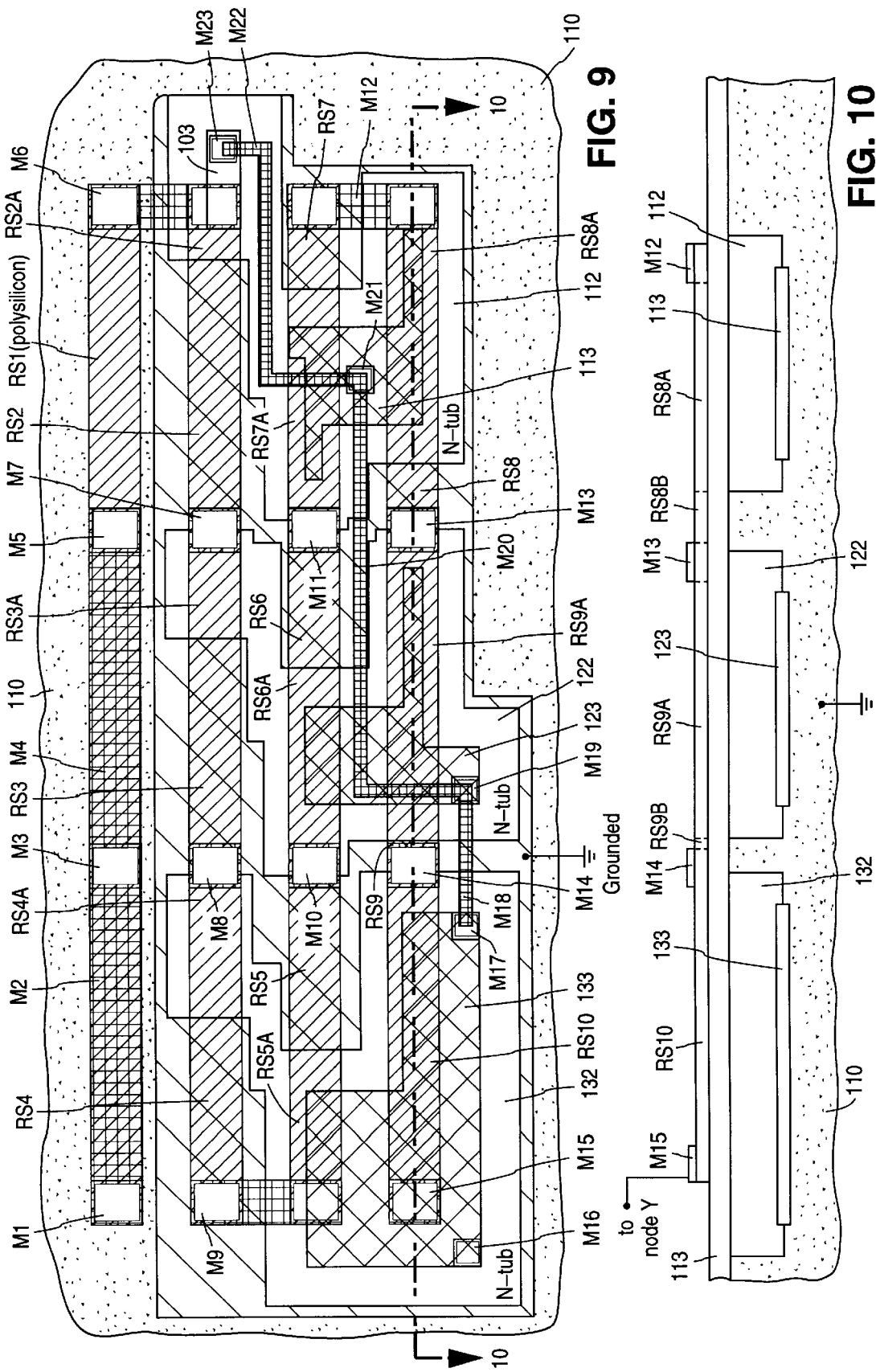

INTEGRATED CIRCUIT HAVING RESISTOR FORMED OVER MULTIPLE TUBS OF SEMICONDUCTOR MATERIAL

BACKGROUND OF THE INVENTION

1. Field of the Invention

The present invention relates generally to integrated circuit implementations of high-speed amplifiers, and more particularly to a preferred implementation of a collector resistor in a high-speed amplifier integrated circuit.

2. Description of the Related Art

FIG. 1 is a schematic diagram of a conventional high-speed cascode amplifier having a push-pull output stage. The circuit asserts amplified output potential Vout in response to input potential Vin, when biased by bias potential Vb (when supply voltage Vcc is applied across its top and bottom rail). The amplifier of FIG. 1 is typically implemented as an integrated circuit (or portion of an integrated circuit), with some or all of its resistors comprising layers of polysilicon over a layer of field oxide (with a substrate of P-type semiconductor material under the field oxide layer). Such an integrated circuit implementation will be assumed in the following description.

In FIG. 1, resistor $R_c$ is connected between nodes X and Y. Node X is coupled to the top rail, which is at potential Vcc. Node Y is coupled to the base of transistor X83, to the collector of transistor X84, and to one end of resistor R22. The circuit has a capacitance (e.g., 5 femtofarads) between node Y and the bottom rail (which is at ground potential), which capacitance is represented by capacitor C145 (shown in phantom view).

The gain of the amplifier of FIG. 1 is determined by the resistance ratio $-R_c/R_e$, where $R_e$ is the equivalent overall resistance connected between the emitter of transistor X91 and the bottom rail. The resistance of gain-setting resistor $R_c$ is typically 3400 Ohms, as indicated in FIG. 1. Resistor $R_c$ typically comprises a polysilicon strip (or multiple polysilicon strips connected in series) over a layer of field oxide, with a substrate of P-type semiconductor material under the field oxide layer.

A limitation of the amplifier of FIG. 1 is that the stray capacitance of polysilicon resistor $R_c$ (over the field oxide on which it is formed) slows down the circuit's output transient response. Thus, the absolute value of the amplifier's gain is necessarily reduced in order to achieve faster transient response (by implementing resistor $R_c$ with reduced resistance)

FIG. 2 is a schematic diagram of a high-speed cascode amplifier which differs from the FIG. 1 amplifier only in that polysilicon resistor $R_c$ is implemented in an improved manner, in order to reduce its stray capacitance over the field oxide on which it is formed, and thus to improve the amplifier's output transient response without reducing the absolute value of its gain. Resistor $R_c$ of the FIG. 2 circuit can be implemented in accordance with the invention (over multiple tubs of semiconductor material), in a manner to be described below with reference to FIGS. 9, 10, and 11.

Alternatively (and not in accordance with the present invention), if the FIG. 2 circuit is implemented over a substrate of P-type semiconductor material, resistor $R_c$ of the FIG. 2 circuit is implemented over a single tub of N-type semiconductor material which is formed in the substrate as shown in FIGS. 3 and 4. This "one-tub" implementation is inferior to the inventive "multiple-tub" implementation of resistor $R_c$ in several respects to be explained below, but it does represent an improvement over the FIG. 1 implementation.

In the implementation of FIGS. 3 and 4, resistor $R_c$ of FIG. 2 comprises ten series-connected strips of polysilicon RS1–RS10. Strips RS1–RS10 are connected in series, with metal connector M6 connecting strips RS1 and RS2, metal connector M7 connecting strips RS2 and RS3, metal connector M8 connecting strips RS3 and RS4, metal connector M9 connecting strips RS4 and RS5, metal connector M10 connecting strips RS5 and RS6, metal connector M11 connecting strips RS6 and RS7, metal connector M12 connecting strips RS7 and RS8, metal connector M13 connecting strips RS8 and RS9, and metal connector M14 connecting strips RS9 and RS10. Metal contact M15 is coupled to node Y (of FIG. 2). Metal contact M5 is coupled through metal contacts M4, M3, and M2 to metal contact M1, and contact M1 is coupled to node X (of FIG. 2).

The implementation of resistor $R_c$ shown in FIGS. 3 and 4 (and the embodiment of FIG. 2 which includes this implementation of $R_c$) is manufactured on a substrate 10 of P-type semiconductor material. On substrate 10, a layer 11 of N-type semiconductor material (denoted as an N+ buried layer in FIG. 4) is formed (such as by implanting N-type impurities in a rectangular region of the substrate material, and then removing unwanted portions of the N-type semiconductor material). Layer 11 has uniform (relatively small) thickness, except that it has relatively large thickness at one portion underlying metal contact M16 (so that layer 11 extends all the way up to contact M16 as shown in FIG. 4). Thus, N-type semiconductor layer 11 has a rectangular periphery as shown in FIG. 3.

After layer 11 has been formed on substrate 10, epitaxial layer 12 of N-type semiconductor material is grown over layer 11 (except for the thick portion of layer 11 which extends up to contact M16) and the portion of substrate 10 around the outer periphery of layer 11. Thus, N-type semiconductor layer 12 has a rectangular periphery (as shown in FIG. 3) which is larger than the rectangular periphery of layer 11.

P-type semiconductor substrate material 10 surrounds the periphery of N-type semiconductor layer 12 (when viewed as in FIG. 3). Layers 11 and 12 of N-type semiconductor material together comprise a large, single tub (well) of N-type semiconductor material in P-type substrate 10.

Field oxide layer 13 is deposited on the exposed upper surfaces of substrate 10 and N-type semiconductor layer 12 (as shown in FIG. 4), but not over the thick portion of layer 11 underlying contact M16. Layer 13 is not shown in FIG. 3, to allow the other layers to be depicted.

Then, multiple strips of polysilicon (e.g., the four parallel strips comprising polysilicon resistor portions RS1–RS10) are deposited on field oxide layer 13. Finally, a pattern of metal (having high electrical conductivity) is deposited on portions of the polysilicon material, on portions of the field oxide layer 13 between the polysilicon strips, and on the thick portion of N-type semiconductor layer 11, to implement metal contacts and connectors M1, M2, M3, M4, M5, M6, M7, M8, M9, M10, M11, M12, M13, M14, M15, and M16 (best shown in FIG. 3). Metal contact M16 is coupled to output node Vout of FIG. 2. Metal contact M1 is coupled to node X (of FIG. 2) so that current can flow from contact M1 through contacts M2, M3, M4, and M5 to one end of polysilicon resistor strip RS1.

By implementing one tub of N-type semiconductor material (layers 11 and 12) in P-type substrate 10 and coupling the tub to output node Vout (via contact M16), the effect of resistor $R_c$'s stray capacitance over field oxide layer 13 is reduced, thus allowing the amplifier to achieve faster output transient response without affecting its gain.

The FIG. 3 embodiment includes a layer of metal (M1–M4) over the left part of the polysilicon strip at the top of FIG. 3 for the following reason. It may be desired to deposit four identical, parallel polysilicon strips on field oxide 13, rather than three long strips and one short strip (e.g., because it is efficient to do so from a manufacturing standpoint), although the total length of all four strips exceeds the desired length of polysilicon material for implementing resistor $R_c$. With four such identical polysilicon strips on the field oxide, the effective resistance of one of the polysilicon strips (i.e., the top strip in FIG. 3) is reduced by coating much of the strip with metal (i.e., to form a large contact comprising metal M1, M2, M3, M4, and M5, as shown in FIG. 3). Also, metal connectors M6–M14 (of FIG. 3) are deposited to short-circuit an end of each polysilicon strip with an end of another one of the strips (and to short-circuit adjoining portions of the three identical strips) to implement resistor $R_c$ with ten equal-length polysilicon resistor portions (i.e., equal-length portions RS1–RS10 of FIG. 3) connected together by metal.

Alternatively (in a variation on FIG. 3), three long polysilicon strips (i.e., strips identical to the three lower polysilicon strips of FIG. 3) and one short polysilicon strip (i.e., one just long enough to implement strip RS1 of FIG. 3) are deposited on field oxide 13. Small metal contact MS is then deposited at one end of the short polysilicon strip and contact MS is connected directly to node X (of FIG. 2). In such implementations, metal M1, M2, M3, and M4 are preferably omitted.

In other variations on the FIG. 3 embodiment, resistor $R_c$ is implemented with more than ten or less than ten polysilicon strips (and/or portions of polysilicon strips connected by metal) deposited on a field oxide layer over a single tub of N-type semiconductor material. The polysilicon strips (or portions of strips between metal connectors) can, but need not, have identical length and resistance. For example, resistor $R_c$ can be implemented as three portions of a single polysilicon strip (with a metal connector deposited between the central portion and the two end portions of the strip. For another example, resistor $R_c$ can be implemented as five parallel strips of polysilicon, with each strip partitioned into three portions (i.e., a total of fifteen polysilicon strip portions) and a metal connector between each pair of adjacent strip portions (i.e., a total of fourteen metal connectors).

As noted, the typical resistance of resistor $R_c$ is about 3400 Ohms (in FIGS. 1 and 2). To implement $R_c$ with this resistance, the total resistance of polysilicon strip portions RS1–RS10 of FIG. 3 should be 3400 Ohms. FIG. 5 is a schematic diagram of the circuit equivalent of the FIG. 3–4 implementation of resistor $R_c$, with parameters chosen so that each of polysilicon strips RS1–RS10 has resistance 340.2 Ohms (so the total resistance of $R_c$ is 3402 Ohms). To allow convenient comparison of the FIG. 5 diagram to the below-discussed FIG. 11 diagram, FIG. 5 treats polysilicon strip RS2 of FIG. 3 as comprising two portions, denoted as $RS2_A$ and $RS2_B$ in FIG. 5, with portion $RS2_A$ being shorter than portion $RS2_B$ and thus having lower resistance (40.8 ohms) than portion $RS2_B$ (whose resistance is 299.4 ohms). Similarly, FIG. 5 treats each of polysilicon strips RS3–RS9 of FIG. 3 as comprising two portions ($RS3_A$ and $RS3_B$, $RS4_A$ and $RS4_B$, $RS5_A$ and $RS5_B$, $RS6_A$ and $RS6_B$, $RS7_A$ and $RS7_B$, $RS8_A$ and $RS8_B$, and $RS9_A$ and $RS9_B$, respectively). FIG. 5 models each resistor portion (which comprises an area of N-type semiconductor material coupled to output node Vout, under an area of polysilicon, and a volume of insulating field oxide therebetween) as a capacitor. The value (indicated in FIG. 3) of the capacitance of each such capacitor assumes a typical thickness (9500 angstroms) of field oxide layer 13. FIG. 5 models N-type layers 11 and 12 (layer 11 being coupled to output node Vout via contact M16) and P-type substrate 10 (coupled to ground as shown in FIG. 4) as a diode D1. Nodes X and Y of FIG. 5 correspond to nodes X and Y of FIG. 2.

The advantage of implementing resistor $R_c$ as in FIGS. 3 and 4 (rather than as in FIG. 1) will be apparent from comparing FIGS. 6 and 7 with FIG. 8. FIG. 6 is a graph representing the output potential (Vout) of the FIG. 1 circuit as a function of time, in response to a square wave input potential Vin (having period 100 nsec), for each of three values of stray capacitance due to three values of the thickness of the field oxide layer on which resistor $R_c$ is formed. FIG. 8 is a graph representing the output potential (Vout) of the FIG. 2 circuit as a function of time, in response to a square wave input potential Vin (having period 100 nsec), for each of the same three values of the thickness of the field oxide layer on which resistor $R_c$ is formed (assuming the FIG. 3–4 implementation of resistor $R_c$). FIG. 6 assumes that resistor $R_c$ is implemented as in FIGS. 3–4, but with layers 11 and 12 and metal contact M16 omitted, and with field oxide layer 13 deposited directly on the P-type semiconductor material comprising substrate 10. Thus, FIG. 6 assumes that there is no tub of N-type semiconductor material under the series-connected polysilicon strips comprising resistor $R_c$.

Curve 31 of FIG. 6 assumes a typical thickness (9500 angstroms) for the field oxide layer. Curve 30 of FIG. 6 assumes that the field oxide layer has twice the typical thickness, and curve 32 of FIG. 6 assumes that the field oxide layer has thickness equal to 67% of the typical thickness.

Because the implementation of resistor $R_c$ of FIG. 1 (which results in the FIG. 6 curves) has a large stray capacitance associated with each resistor portion (each resistor portion comprising an area of grounded substrate material, under an area of polysilicon, with a volume of field oxide therebetween), the leading and trailing edges of each of curves 30, 31, and 32 of FIG. 6 exhibit sluggish rise and fall times.

Because the FIG. 3 implementation of resistor $R_c$ of FIG. 2 (which results in the FIG. 8 curves) employs bootstrapping (each resistor portion comprises an area of N-type semiconductor material coupled to the output node Vout, under an area of polysilicon, with a volume of field oxide therebetween) the effect of resistor $R_c$'s stray capacitance over the field oxide layer is reduced, causing the leading and trailing edges of each of curves 40, 41, and 42 of FIG. 8 to have shorter rise and fall times than do the leading and trailing edges of curves 30, 31, and 32 of FIG. 6. However, the leading and trailing edges of each of curves 40, 41, and 42 of FIG. 8 exhibit large overshoot and large differences in overshoot from curve to curve which are not acceptable for many amplifier applications. The present invention eliminates this problem.

Also, the slope (and overshoot) of the leading and trailing edges of both FIG. 6 and FIG. 8 undesirably depend on the thickness of the field oxide layer on which the polysilicon resistor strips are deposited. As most apparent from FIG. 7 (which is an enlarged detail of a portion of each of curves 30, 31, and 32 of FIG. 6), the overshoot value of curve 30 (the amount by which the maximum value of the curve exceeds the upper plateau to which each cycle of the curve settles) which is associated with a relatively thick field oxide layer, and the leading edge slope of curve 30, are greater than the overshoot value and leading edge slope of curve 31 (associated with a thinner field oxide layer), and much greater than the overshoot value and leading edge slope of curve 32 (associated with an even thinner field oxide layer). This dependence on field oxide layer thickness (apparent from FIGS. 6 and 7) is due to the time constant associated with resistor $R_c$ and the stray capacitance of this resistor to the semiconductor substrate. Decrease in the thickness of the field oxide layer results in larger stray capacitance to ground, and thus smaller slope and smaller overshoot of the leading and trailing edges.

On the other hand, the phenomenon apparent from FIG. 8 has another cause: decrease in the thickness of the field oxide layer results in larger stray capacitance to the output node $V_{out}$, and thus more positive feedback from $V_{out}$ to $R_c$ through this stray capacitance, and thus greater slope and greater overshoot of the leading and trailing edges. The overshoot value and leading edge slope of curve 40 (associated with a relatively thin field oxide layer) are greater than the overshoot value and leading edge slope of curve 41 (associated with a thicker field oxide layer), and much greater than the overshoot value and leading edge slope of curve 42 (associated with an even thicker field oxide layer).

Until the present invention, it had not been appreciated that the structure of conventional implementations of the gain-setting resistor $R_c$ of a high-speed amplifier of the type shown in FIGS. 1 and 2 strongly affects the amplifier's response time (the speed at which it responds to a change in the input signal) and the overshoot values of the amplifier's response to a time varying input in the manner discussed above. Nor had it been known how to implement a gain-setting resistor in an amplifier of this type to overcome the noted problems with (and limitations of) conventional implementations of such an amplifier.

SUMMARY OF THE INVENTION

In a class of preferred embodiments, the invention is an amplifier implemented as an integrated circuit, including a gain-setting resistor having multiple, series-connected resistor segments formed over multiple tubs of semiconductor material of a first polarity (i.e., N-type or P-type material) in a semiconductor substrate of the opposite polarity. The resistor segments are connected in series between a first node (whose potential varies no more than insignificantly, in typical embodiments) and a second node (whose potential varies in response to changes in the amplifier's input signal). The resistor is implemented with multiple bootstrapping, in the sense that all tubs are coupled to a third node of the amplifier whose potential changes (in response to a change in the input signal) in such a direction as to pull the potential at the second node in a desired direction. In some implementations, each resistor segment is formed over a different one of the tubs (there is a one-to-one correspondence between tubs and segments). Alternatively, there are more segments than tubs (more than one resistor segment formed over a single one of the tubs, more than one segment formed over each of two or more tubs, or at least one segment having no tub under it). The invention is most useful where the amplifier is expected to operate at high speed, in response to a rapidly varying input signal. Unless formed over multiple tubs in accordance with the invention, the resistor (which functions to set the amplifier's gain) would be subject to the problem of slow response (due to stray capacitance of its resistor segments over a large volume of semiconducting material at ground potential or another fixed potential) to the amplifier's time-varying input and (if implemented with a field oxide layer between the volume of semiconducting material and the resistor segments) to the problem of dependence of such response time on the field oxide layer thickness.

In a class of preferred embodiments, the invention is a high-speed cascode amplifier (e.g., of the type shown in FIG. 2) and the gain-setting resistor is coupled to the top rail. The top rail potential is fixed, and multiple bootstrapping is implemented by coupling each tub to the amplifier's output node. Preferably, the resistor segment farthest from the top rail overlies the largest tub (or tub portion) to provide the biggest stray capacitance to $V_{out}$ for more positive feedback and the smallest capacitance (e.g., no capacitance) to the semiconductor substrate, and the resistor segment coupled to the top rail overlies the smallest tub (or tub portion) to provide the smallest stray capacitance to $V_{out}$ for less positive feedback and the largest capacitance to the semiconductor substrate. Also preferably, the sizes of the tubs (or tub portions) under different segments of the resistor increase with increasing distance along the resistor from the top rail end, and the separation between each two adjacent tubs (or tub portions) which underlie adjacent segments of the resistor decreases with increasing distance along the resistor away from the top rail end of resistor. By so designing the amplifier, the output transient of the amplifier is made insensitive to the thickness of the field oxide layer.

In one such preferred embodiment, the resistor comprises ten segments of polysilicon connected in series over three tubs of N-type semiconductor material in a P-type semiconductor substrate (with a field oxide layer separating each tub from the segment or segments overlying it). Each segment has the same length. No tub underlies the segment at the top rail end of the resistor. A small portion of one tub underlies a small portion of the next segment, and an increasingly large tub portion underlies a corresponding portion of each subsequent segment along the resistor. Thus, 0% of the first segment (at the top rail end) overlies a tub, A% of the second segment (the segment next to the top end segment) overlies a tub, B% of the third segment overlies a tub (where B is a number greater than A), C% of the fourth segment overlies a tub (where C is a number greater than B), and so on until 100% of the tenth segment (the segment at the end farthest from the top rail end) overlies a tub. The distance along the resistor between the tub portions under the second and third segments is greater than the distance along the resistor between the tub portions under the third and fourth segments, and so on (i.e., the smallest distance along the resistor between tub portions under adjacent segments is the distance between the tub portions under the ninth and tenth segments). In a variation on this implementation, nine separate tubs of N-type semiconductor material are formed in the substrate, the segment at the top rail end of the resistor does not overlie any tub, and each tub underlies a different one of the other nine segments.

Another aspect of the invention is an integrated circuit (not necessarily an amplifier) which includes a resistor having multiple, series-connected resistor segments formed over multiple tubs of semiconductor material of a first polarity (i.e., N-type or P-type material) in a semiconductor substrate of the opposite polarity. The resistor segments are connected in series between a first node (whose potential varies no more than insignificantly in some embodiments) and a second node (whose potential varies in response to changes in an input signal). The resistor is implemented with multiple bootstrapping in the sense that all tubs are coupled to a third node of the circuit whose potential changes (in response to a change in the input signal) in such a direction as to pull the potential at the resistor's second node in the desired direction. In some implementations, each segment is formed over a different one of the tubs (there is a one-to-one correspondence between tubs and segments). In alternative implementations, there are more segments than tubs (more than one resistor segment formed over a single one of the tubs, more than one segment formed over each of two or more tubs, or at least one segment having no tub under it). Unless formed over multiple tubs in accordance with the invention, the resistor would be subject to the problem of slow response to the time-varying input signal (due to large stray capacitance of its resistor segments over a large volume of semiconducting material at ground potential or another fixed potential) and (if implemented with a field oxide layer between the volume of semiconducting material and the resistor segments) to the problem of dependence of its response time on the field oxide layer thickness. It is useful to implement the integrated circuit in accordance with the invention where it is expected that the input signal will vary rapidly over time, to cause the circuit to assert a corresponding rapidly varying potential at each of the second node and the third node. In preferred embodiments in which the first node has fixed (or substantially fixed) potential, the resistor segment farthest from the first node overlies the largest tub (or tub portion), the resistor segment coupled to the second node overlies the smallest tub (or tub portion), the sizes of the tubs (or tub portions) under different segments of the resistor increase with increasing distance along the resistor from the first node, and the separation between each two adjacent tubs (or tub portions) which underlie adjacent segments of the resistor decreases with increasing distance along the resistor away from the first node. In other words, where the first node is at a potential which is at least substantially fixed, the tub area underlying each of the segments preferably increases from segment to segment with increasing distance along the resistor from the first node, and the separation between the tub areas which underlie adjacent segments decreases with increasing distance along the resistor from the first node.

BRIEF DESCRIPTION OF THE DRAWINGS

FIG. 3 does not show the field oxide layer on which polysilicon resistors RS1–RS10 are formed, and is partially cut away to show portions of several layers underlying the field oxide layer.

FIG. 9 is a top view of a preferred implementation, in accordance with the present invention, of resistor $R_c$ of FIG. 2. FIG. 9 does not show the field oxide layer on which polysilicon resistors RS1–RS10 are formed, and is partially cut away to show portions of several layers underlying the field oxide layer.

FIG. 10 is a cross-sectional side view of resistor $R_c$ of FIG. 9, taken along line 10—10 of FIG. 9.

DETAILED DESCRIPTION OF THE PREFERRED EMBODIMENTS

Figure 1:
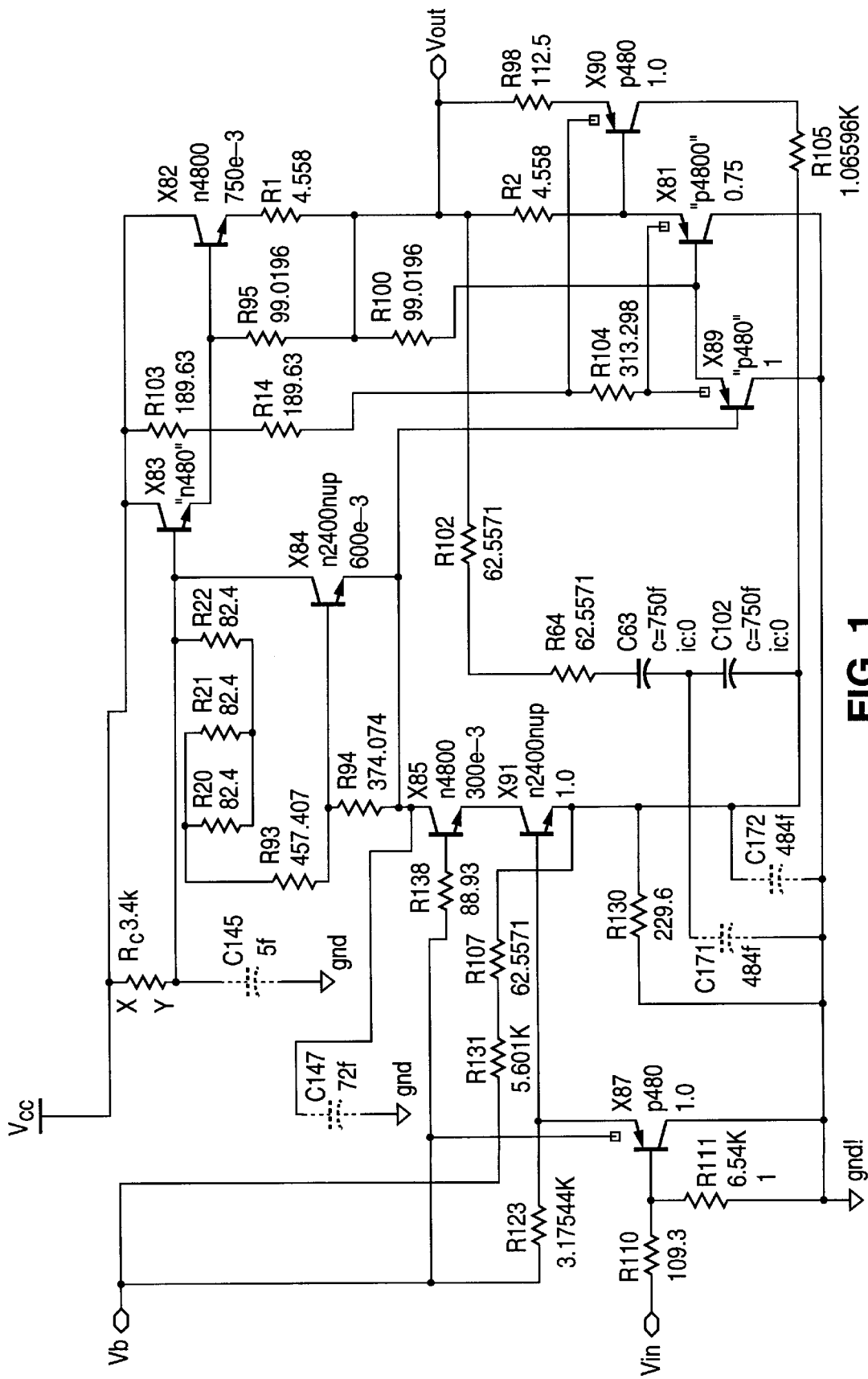
FIG. 1 is a schematic diagram of a conventional cascode amplifier having a push-pull output stage.

A preferred implementation, in accordance with the present invention, of resistor $R_c$ of FIG. 2 will be described with reference to FIGS. 9–11.

FIG. 9, a top view of this implementation of resistor $R_c$, does not show the field oxide layer on which polysilicon resistors RS1–RS10 are formed. This field oxide layer (identified by reference numeral 113) is shown in FIG. 10 (which is a cross-sectional side view of resistor $R_c$ of FIG. 9). FIG. 9 is partially cut away to show portions of several layers underlying field oxide layer 113 (e.g., layer 133 of N-type semiconductor material, which underlies layer 132 as shown in FIG. 10).

Figure 2:
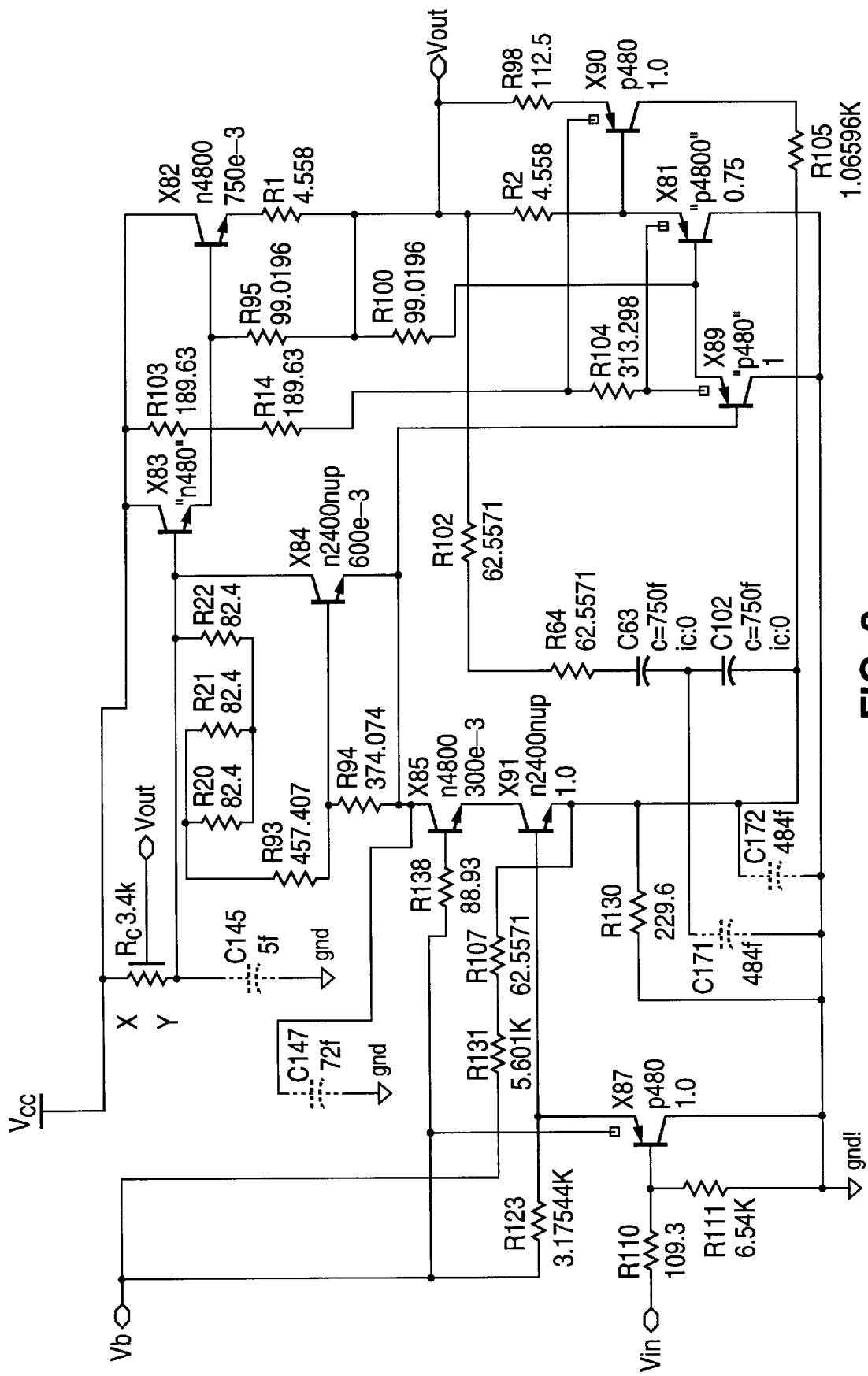
FIG. 2 is a schematic diagram of a variation on the amplifier of FIG. 1, in which resistor $R_c$ can (but need not) be implemented in accordance with the invention.

In the implementation of FIGS. 9 and 10, resistor $R_c$ of FIG. 2 comprises ten series-connected strips RS1–RS10 of polysilicon (alternatively, these strips can consist of resistor material other than polysilicon). Strips RS1–RS10 are connected in series, with metal connector M6 connecting strips RS1 and RS2, metal connector M7 connecting strips RS2 and RS3, metal connector M8 connecting strips RS3 and RS4, metal connector M9 connecting strips RS4 and RS5, metal connector M10 connecting strips RS5 and RS6, metal connector M11 connecting strips RS6 and RS7, metal connector M12 connecting strips RS7 and RS8, metal connector M13 connecting strips RS8 and RS9, and metal connector M14 connecting strips RS9 and RS10. Metal contact M15 is coupled to node Y (of FIG. 2). Metal contact M5 is coupled through metal contacts M4, M3, and M2 to metal contact M1, and contact M1 is coupled to node X (of FIG. 2).

The implementation of resistor $R_c$ shown in FIGS. 9 and 10 (and the embodiment of FIG. 2 which includes this implementation of $R_c$) is manufactured on a substrate 110 of P-type semiconductor material. On substrate 110, four separated layers 103, 113, 123, and 133 of N-type semiconductor material are formed (such as by implanting N-type impurities in regions of the substrate material having the peripheries shown in FIG. 9, and then removing unwanted portions of the N-type semiconductor material). Layer 133 has uniform (relatively small) thickness, except that it has relatively large thickness at one portion underlying metal contact M16 and another portion underlying metal contact M17 (so that layer 133 extends all the way up to each of contact M16 and M17, in the same way that layer 11 of FIG. 4 extends up to contact M16 in FIG. 4). Similarly, layer 123 has uniform (relatively small) thickness except that it has relatively large thickness at one portion underlying metal contact M19 (so that layer 123 extends all the way up to contact M19, layer 113 has uniform (relatively small) thickness except that it has relatively large thickness at one portion underlying metal contact M21 (so that layer 113 extends all the way up to contact M21), and layer 103 has uniform (relatively small) thickness except that it has relatively large thickness at one portion underlying metal contact M23 (so that layer 103 extends all the way up to contact M23).

For reasons to be explained below, N-type semiconductor layers 113, 123, and 133 have the irregular peripheries shown in FIG. 9.

After layers 103, 113, 123, and 133 have been formed on substrate 110, epitaxial layer 112 of N-type semiconductor material is grown over layers 103 and 113 and the portion of substrate 110 around the outer peripheries of layers 103 and 113, epitaxial layer 122 of N-type semiconductor material is grown over layer 123 and the portion of substrate 110 around the outer periphery of layer 123, and epitaxial layer 132 of N-type semiconductor material is grown over layer 133 (except for the thick portion of layer 133 which extends up to contact M16) and the portion of substrate 110 around the outer periphery of layer 133. For reasons to be explained below, N-type semiconductor layer 112 has the irregular periphery shown in FIG. 9 (and extends over a larger area of substrate 110 than do layers 103 and 113), N-type semiconductor layer 122 has the irregular periphery shown in FIG. 9 (and extends over a larger area of substrate 110 than does layer 123), and N-type semiconductor layer 132 has the irregular periphery shown in FIG. 9 (and extends over a larger area of substrate 110 than does layer 133).

P-type semiconductor substrate material 110 surrounds the periphery of each of N-type semiconductor layers 112, 122, and 132. Thus, layers 112, 103, and 113 of N-type semiconductor material together comprise a first tub (well) of N-type semiconductor material in P-type substrate 110, layers 122 and 123 of N-type semiconductor material together comprise a second tub of N-type semiconductor material in P-type substrate 110, and layers 132 and 133 of N-type semiconductor material together comprise a third tub of N-type semiconductor material in P-type substrate 110.

Field oxide layer 113 is deposited on the exposed upper surfaces of substrate 110 and N-type semiconductor layers 112, 122, and 132 (as shown in FIG. 9), but not over the thick portions of layers 133, 123, 113, and 103 (which underlie contacts M16, M17, M19, M21, and M23, respectively). Layer 113 is not shown in FIG. 3, to allow the other layers to be depicted. Then, multiple strips of polysilicon (e.g., the four parallel strips comprising polysilicon resistor portions RS1–RS10) are deposited on field oxide layer 113.

Finally, a pattern of metal (having high electrical conductivity) is deposited on portions of the polysilicon material, on portions of the field oxide layer 113 between the polysilicon strips, and on the thick portion of N-type semiconductor layers 133, 123, 113, and 103 to implement metal contacts and connectors M1, M2, M3, M4, M5, M6, M7, M8, M9, M10, M11, M12, M13, M14, M15, M16, M17, M18, M19, M20, M21, M22, and M23 (best shown in FIG. 9). Metal contact M16 is coupled to output node Vout of FIG. 2. Connectors M18 (connecting contacts M17 and M19), M20 (connecting contacts M19 and M21), and M22 (connecting contacts M21 and M23) connect all of layers 133, 123, 113, and 103 together, so that these four layers (and thus each of the first, second, and third tubs of N-type material) are coupled to output node Vout. Metal contact M1 is coupled to node X (of FIG. 2) so that current can flow from contact M1 through contacts M2, M3, M4, and M5 to one end of polysilicon resistor strip RS1. Metal contact M15 is coupled to node Y (of FIG. 2) so that current which has flowed through all the series-connected resistor strips RS1–RS10 can flow to node Y.

Figure 3:
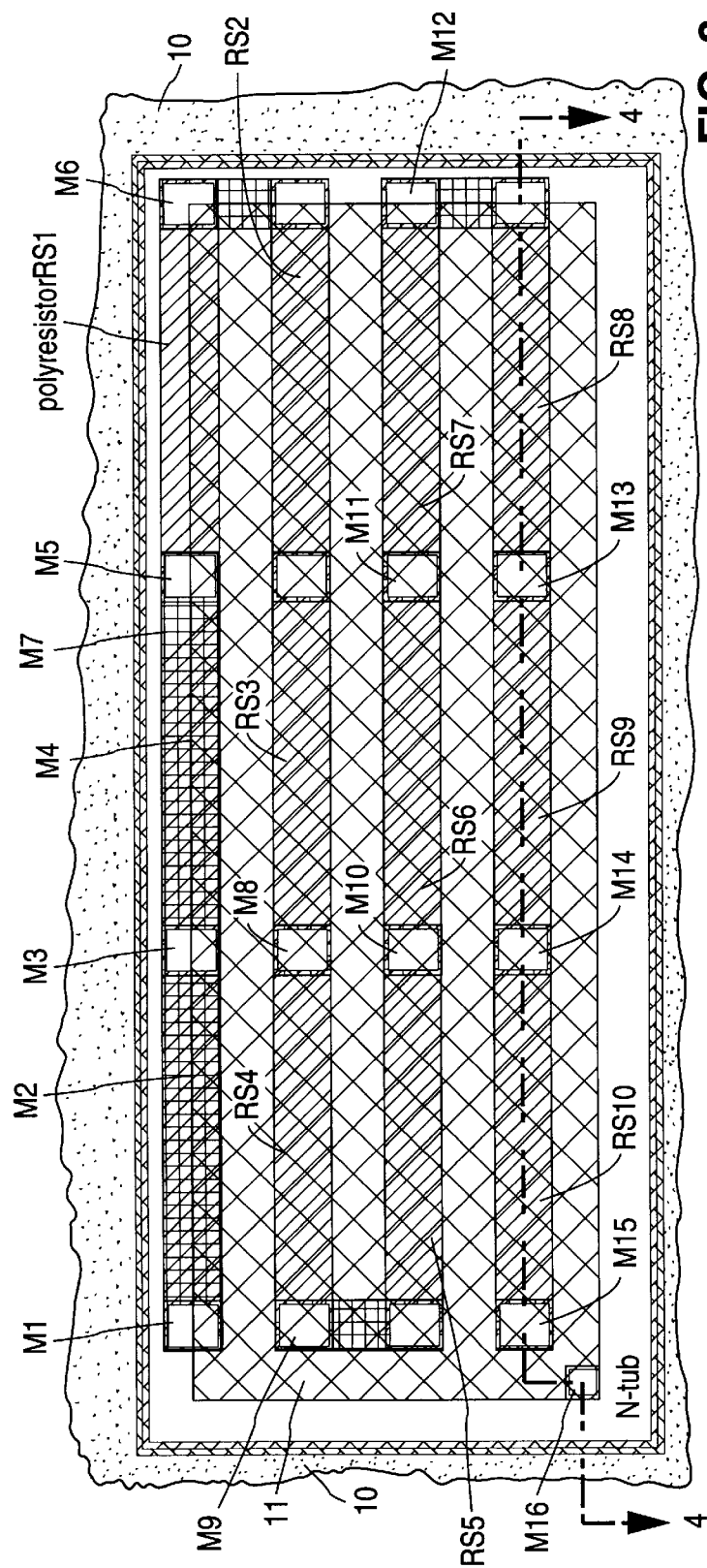
FIG. 3 is a top view of an implementation of resistor $R_c$ of FIG. 2.
Figure 4:
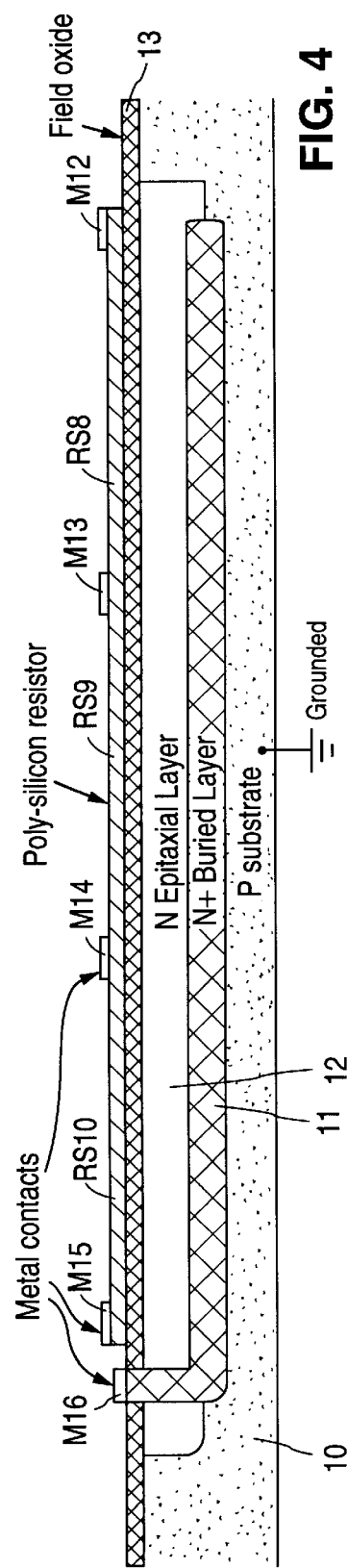
FIG. 4 is a cross-sectional side view of resistor $R_c$ of FIG. 3, taken along path 4—4 of FIG. 3. Since path 4—4 comprises two linear sections (one offset from the other as shown in FIG. 3), FIG. 4 includes not only a section of metal contact M16 but also sections of metal contacts M13, M14, and M15, although contact M16 is spaced closer to the bottom of FIG. 3 than are contacts M13, M14, and M15.
Figure 5:
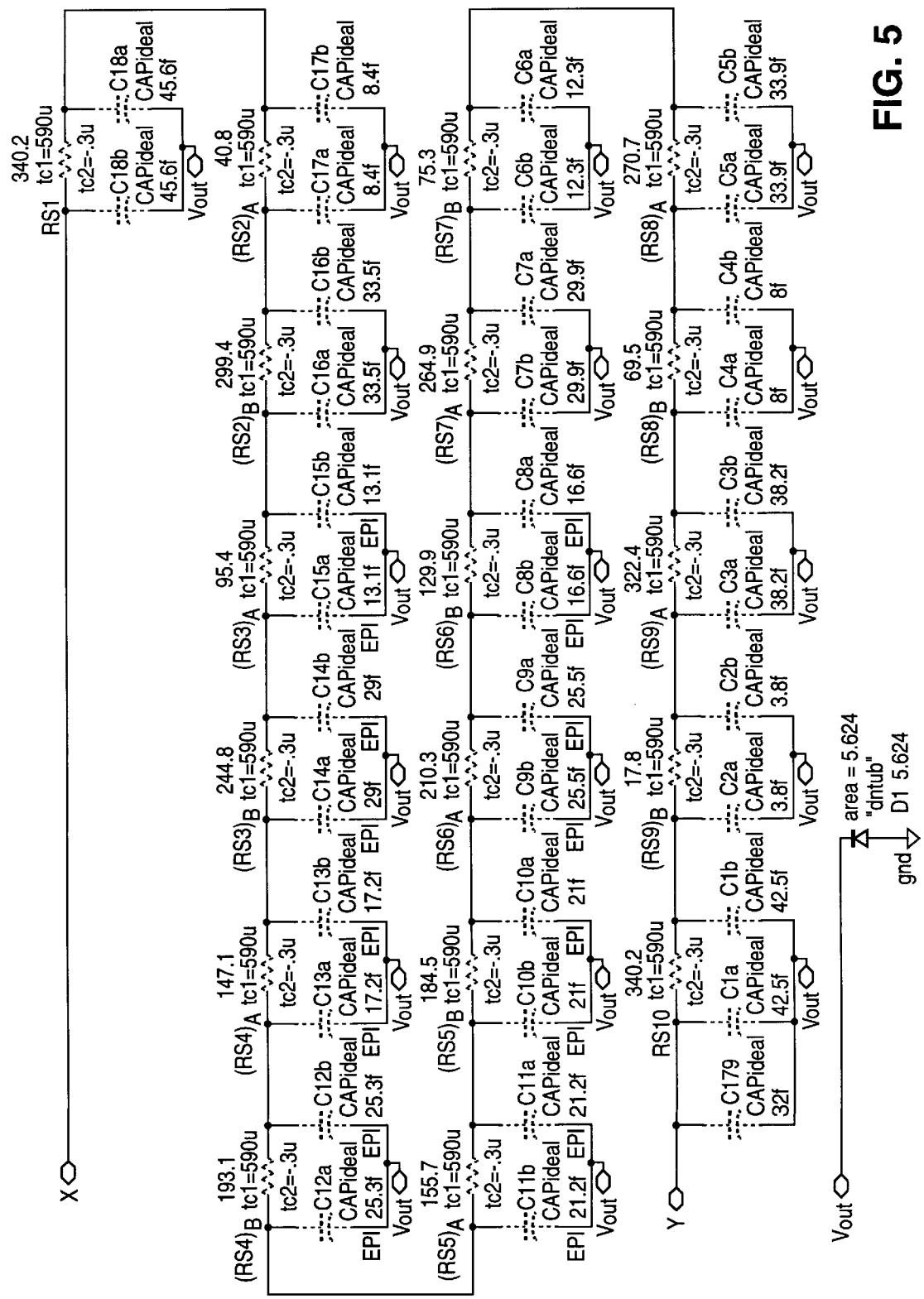
FIG. 5 is a schematic diagram of the circuit equivalent of the FIG. 3 implementation.

Thus, the FIG. 3–4 implementation of resistor $R_c$ has three separate tubs of N-type semiconductor material formed in P-type substrate 110: a first tub comprising layers 112, 103, and 113; a second tub comprising layers 122 and 123; and a third tub comprising layers 132 and 133. The three tubs are coupled to output node Vout of the FIG. 2 amplifier.

The profiles of the tubs (when viewed as in FIG. 9) are chosen so that resistor strip RS1 overlies P-type substrate 110 (rather than one of the N-type tubs); a small portion (RS2A) of resistor strip RS2 overlies the first tub of N-type material; a larger portion RS3A of resistor strip RS3 overlies the second tub of N-type material (portion RS3A is slightly larger than portion RS2A); a larger portion RS4A of resistor strip RS4 overlies the third tub of N-type material (portion RS4A is slightly larger than portion RS3A); a larger portion RS5A of resistor strip RS5 overlies the third tub of N-type material (portion RS5A is slightly larger than portion RS4A); a larger portion RS6A of resistor strip RS6 overlies the second tub (portion RS6A is slightly larger than portion RS5A); a larger portion RS7A of resistor strip RS7 overlies the first tub (portion RS7A is slightly larger than portion RS6A); a larger portion RS8A of resistor strip RS8 overlies the first tub (portion RS8A is slightly larger than portion RS7A); an even larger portion RS9A of resistor strip RS9 overlies the second tub (portion RS9A is slightly larger than portion RS8A); and all of resistor strip RS10 overlies the third tub.

In variations on the FIG. 3–4 implementation, two tubs (or more than three tubs) are formed in the substrate under the resistor strips, or three tubs having different sizes and/or shapes than those of FIG. 3 are formed in the substrate under the resistor strips.

In general, in implementing the invention it is preferred that: the segment of resistor $R_c$ that is farthest from the top rail (i.e., the end which is coupled to node Y of FIG. 2, which is the collector of transistor X84 of the FIG. 2 amplifier) is positioned over the largest tub (or tub portion), the segment of resistor $R_c$ coupled to node X (the top rail) is positioned over the smallest tub (or tub portion), the sizes of the tubs (or tub portions) under different segments of resistor $R_c$ increase with increasing distance along the resistor from the "top rail" end of resistor $R_c$ (e.g., in FIG. 9, no N-type tub portion underlies resistor segment RS1 at the "top rail" end of the resistor, tub portion RS3A under resistor segment RS3 is larger than tub portion RS2A under resistor segment RS2, tub portion RS5A under resistor segment RS5 is larger than tub portion RS4A under resistor segment RS4 which is in turn larger than tub portion RS3A, tub portion RS7A under resistor segment RS7 is larger than tub portion RS6A under resistor segment RS6 which is in turn larger than tub portion RS5A, tub portion RS9A under resistor segment RS9 is larger than tub portion RS8A under resistor segment RS8 which is in turn larger than tub portion RS7A, and the tub portion under resistor segment RS10 which is the farthest segment along the resistor from the "top rail" end is larger than portion RS9A), and the separation between each two adjacent tubs (or tub portions) which underlie adjacent portions of resistor $R_c$ decreases with increasing distance along the resistor away from the "top rail" end of resistor $R_c$ (e.g., in FIG. 9, tub portion RS2A is farther from tub portion RS3A than tub portion RS3A is from RS4A, and so on). As in both the FIG. 3–4 and FIG. 9–10 embodiments, it is typically unnecessary to have any N-type tub at all under the "top rail" end of resistor $R_c$, since the top rail potential Vcc does not typically vary (so that bootstrapping, i.e. positive feedback from $V_{out}$, is not required for the resistor segment to which the top rail potential is directly applied).

By designing the inventive resistor in accordance with the layout criteria of the previous paragraph, the total area (and volume) of the N-type tubs is minimized and the amplifier's output transient response is made maximally insensitive to the thickness of the field oxide layer in the resistor.

Figure 11:
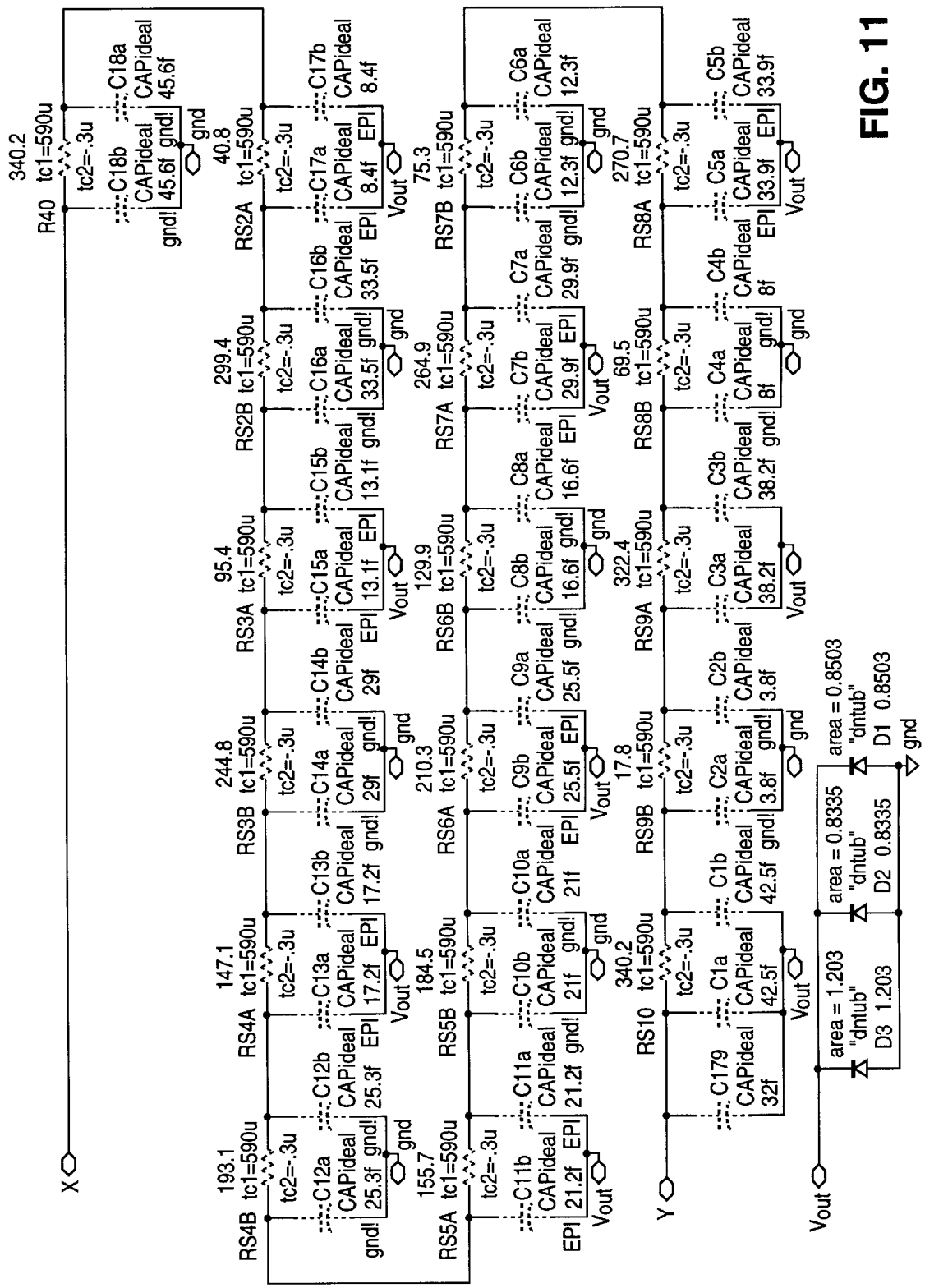
FIG. 11 is a schematic diagram of the circuit equivalent of the FIG. 9 implementation.

FIG. 11 is a schematic diagram of the circuit equivalent of the FIG. 9–10 implementation of resistor $R_c$, with parameters chosen so that each of polysilicon strips RS1–RS10 9 has a resistance of 340.2 Ohms (so the total resistance of $R_c$ is 3402 Ohms). The portions of polysilicon strips RS2–RS9 of FIG. 9 which overlie N-type tubs are denoted in FIG. 11 as RS2A, RS3A, RS4A, RS5A, RS6A, RS7A, RS8A, and RS9A, respectively. The portions of polysilicon strips RS2–RS9 of FIG. 9 which do not overlie N-type tubs are denoted in FIG. 11 as RS2B, RS3B, RS4B, RS5B, RS6B, RS7B, RS8B, and RS9B, respectively. Portion RS2A is shorter than portion RS2B and thus has lower resistance (40.8 ohms) than portion RS2B (whose resistance is 299.4 ohms), and the relative length ratios of the other portions of strips RS2–RS9 are as indicated. FIG. 11 models each of resistor portions RS2A–RS9A and RS2B–RS9B (which comprises an area of N-type semiconductor material coupled to output node Vout or grounded P-type semiconductor material, under an area of polysilicon, and a volume of insulating field oxide therebetween) as a capacitor. The value (indicated in FIG. 11) of the capacitance of each such capacitor assumes that field oxide layer 113 has a typical thickness (9500 angstroms). FIG. 11 models N-type layers 103, 113, and 112 (layers 103 and 113 being coupled to output node Vout via contacts M21 and M23) and P-type substrate 110 (coupled to ground as shown in FIG. 10) as a diode D1, N-type layers 123 and 122 (layer 123 being coupled to output node Vout via contact M19) and P-type substrate 110 (coupled to ground) as another diode D2, and N-type layers 133 and 132 (layer 133 being coupled to output node Vout via contact M16) and P-type substrate 110 (coupled to ground) as a third diode D3. Nodes X and Y of FIG. 11 correspond to nodes X and Y of FIG. 2.

Figure 6:
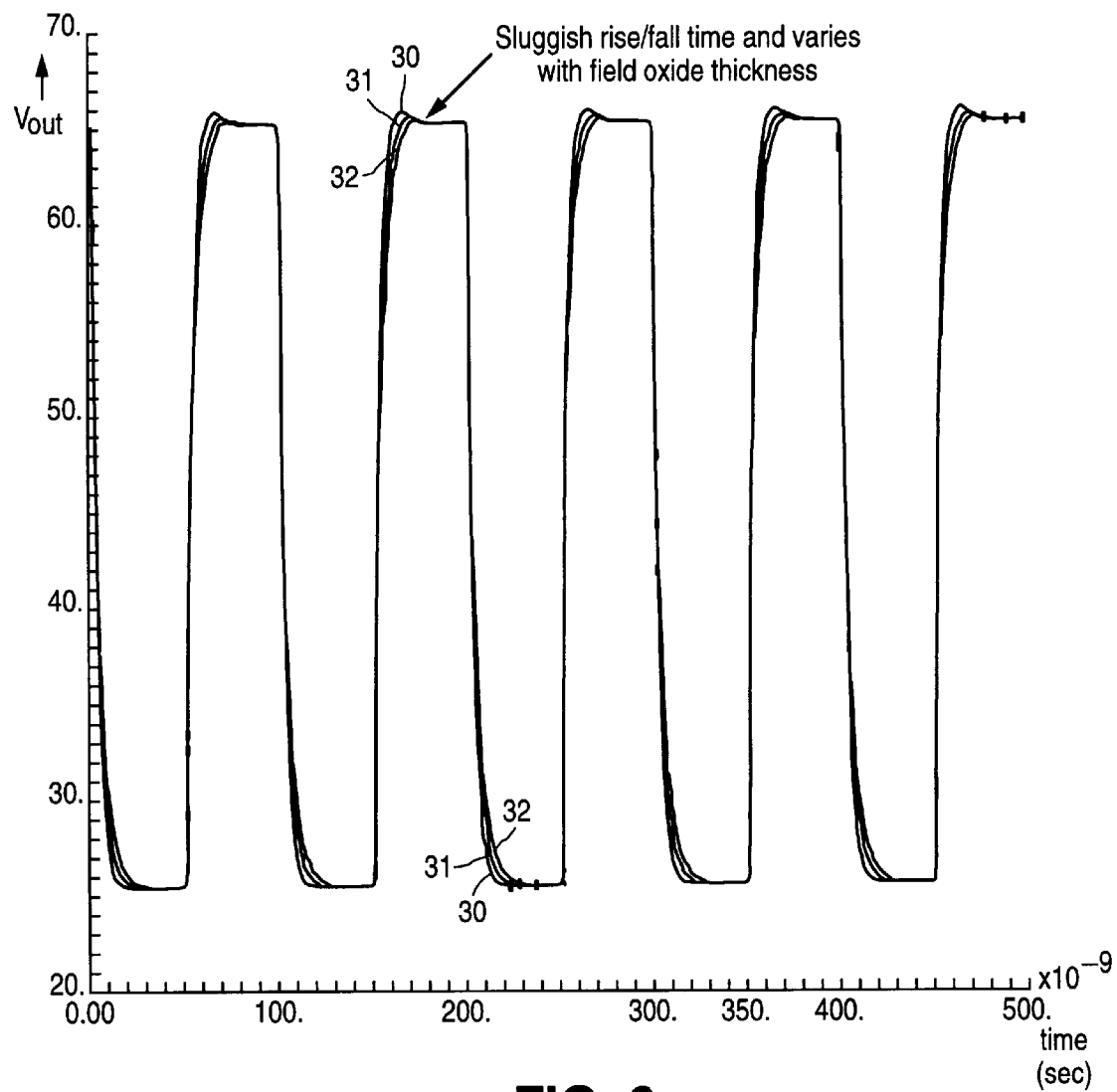
FIG. 6 is a graph of the output potential of the FIG. 1 circuit (with resistor $R_c$ implemented by series-connected polysilicon strips over field oxide, with the field oxide deposited directly on a P-type substrate) as a function of time, in response to a square wave input potential (for each of three values of field oxide thickness).
Figure 7:
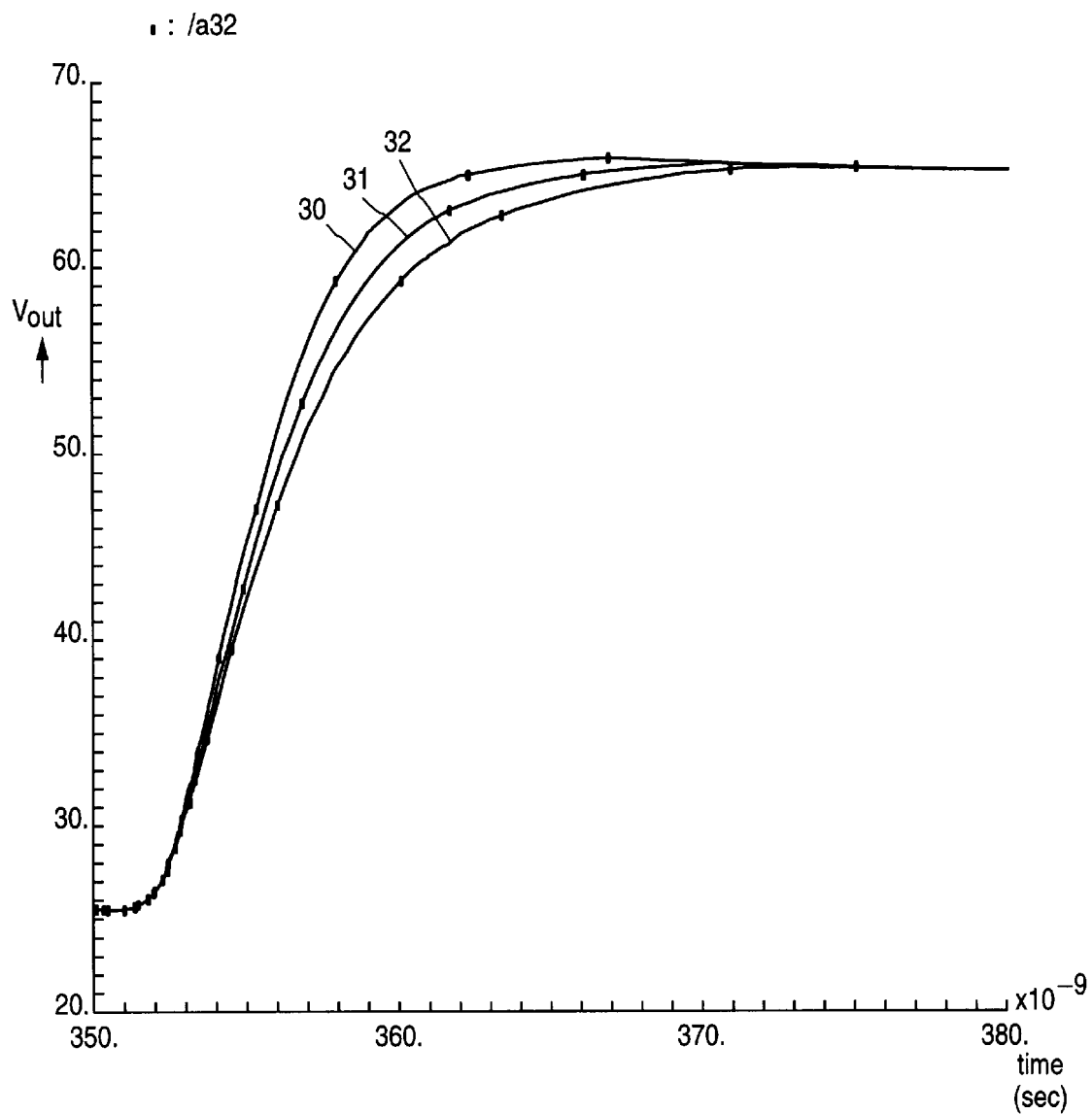
FIG. 7 is an enlarged detail of a portion of each of the three curves of FIG. 6.
Figure 8:
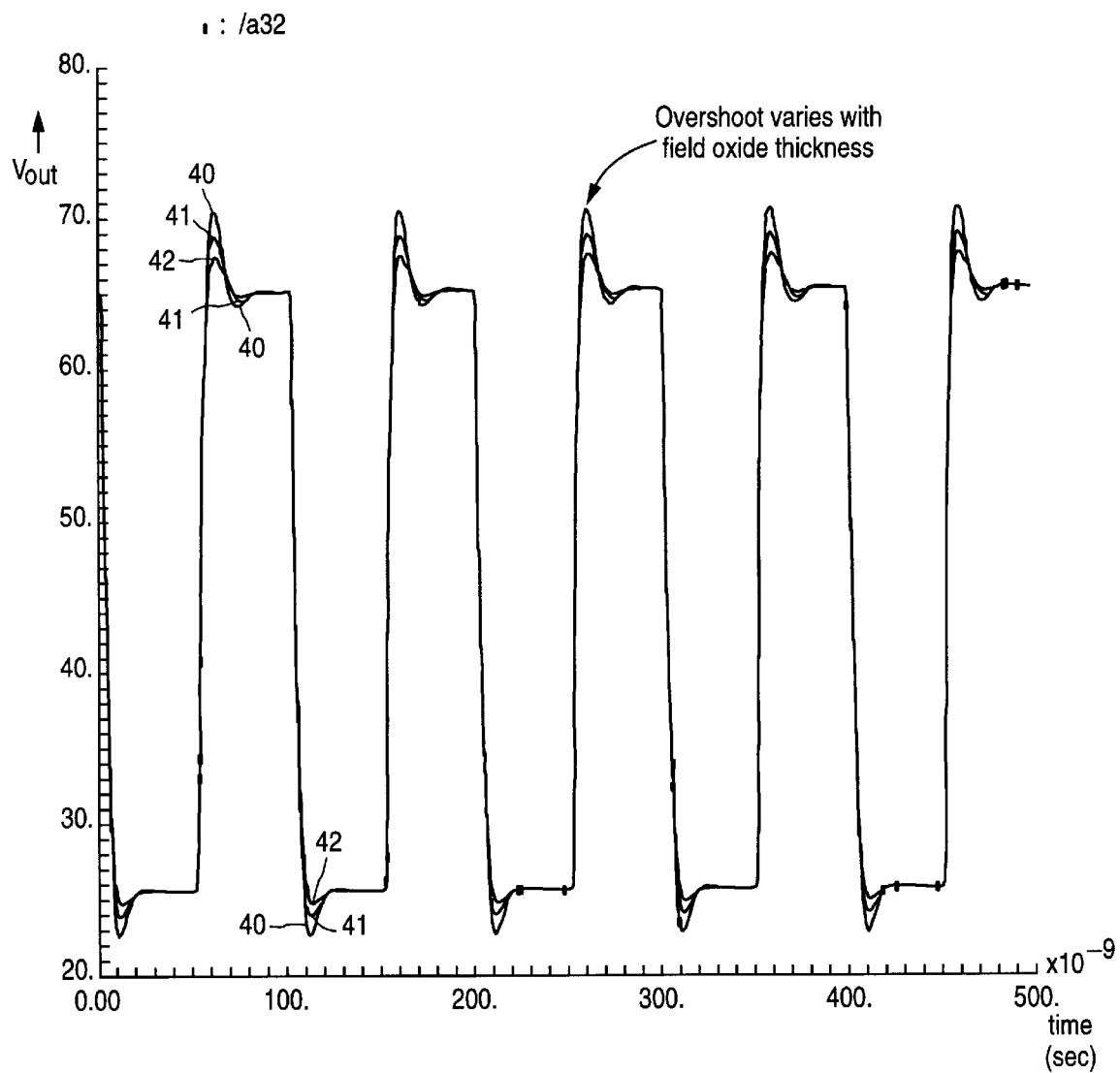
FIG. 8 is a graph representing the output of the FIG. 2 circuit (with resistor $R_c$ implemented by series-connected polysilicon strips over field oxide, with the field oxide deposited on a single tub of N-type semiconductor material in a P-type substrate) as a function of time, in response to a square wave input potential (for each of three values of field oxide thickness).
Figure 12:
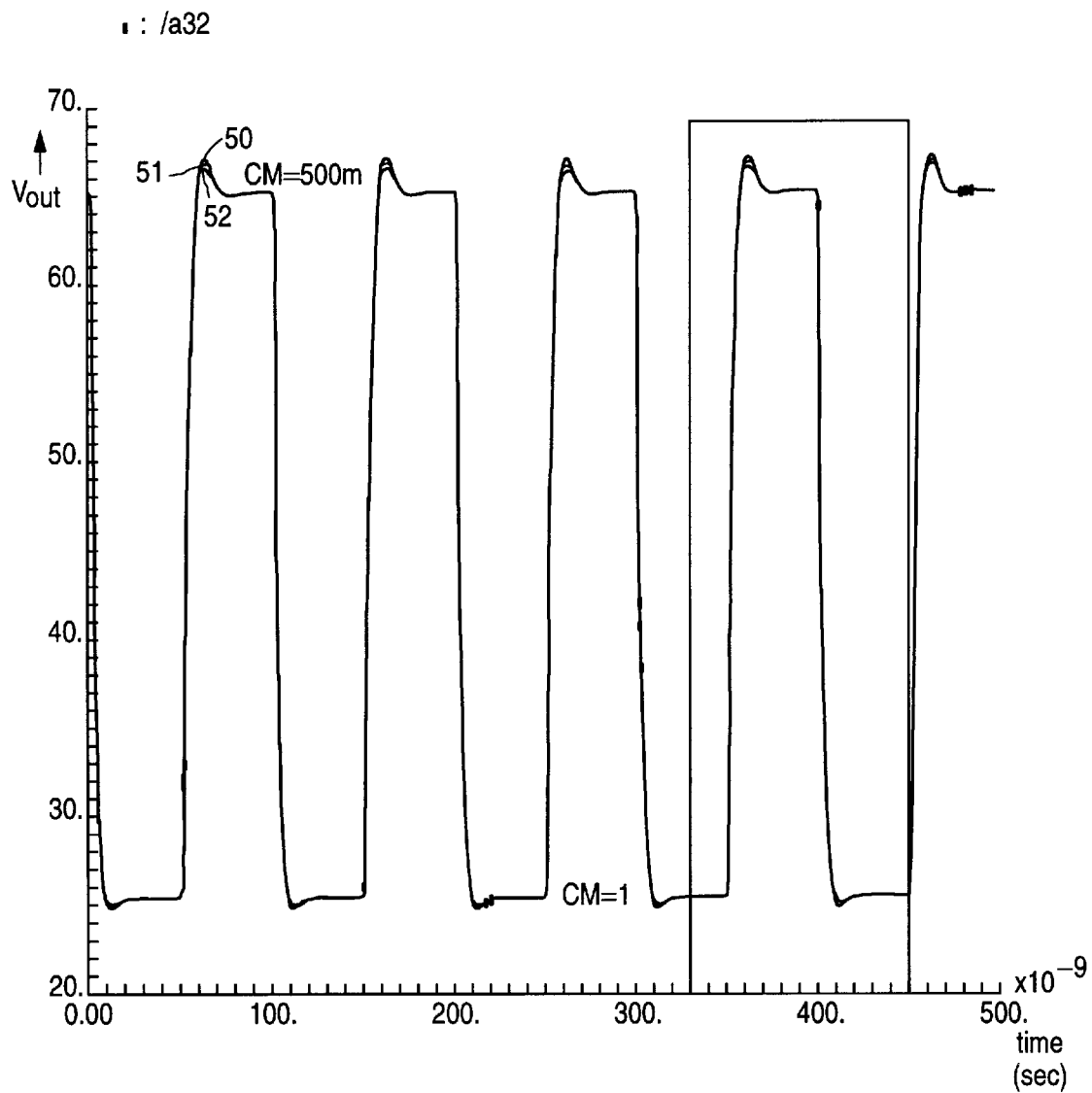
FIG. 12 is a graph representing the output of the FIG. 2 circuit (with resistor $R_c$ implemented as in FIG. 9) as a function of time, in response to a square wave input potential (for each of three values of field oxide thickness).
Figure 13:
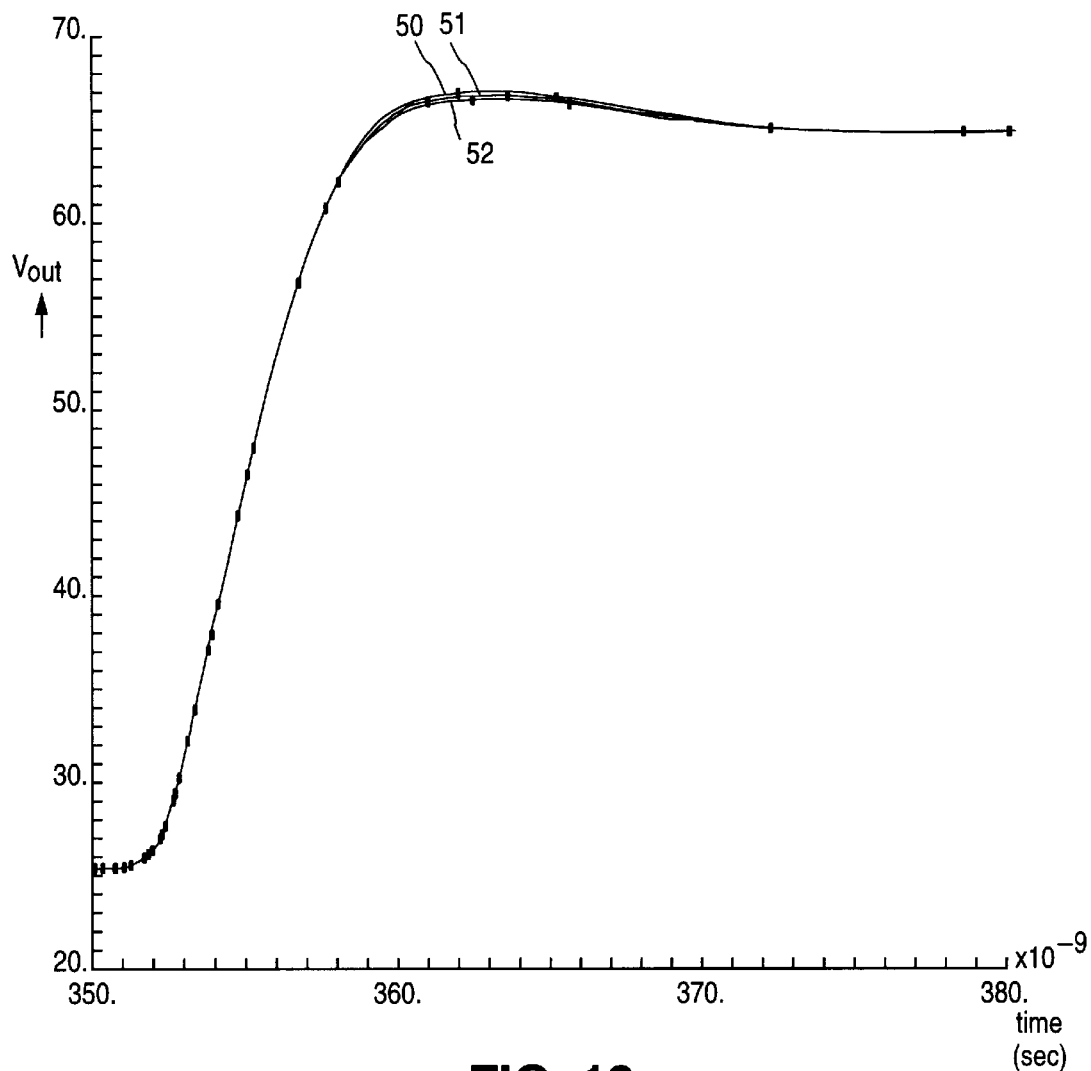
FIG. 13 is an enlarged detail of a portion of each of the three curves of FIG. 12.

The advantage of implementing resistor $R_c$ as in FIGS. 9 and 10 (rather than as in FIGS. 3 and 4 or FIG. 1) will be apparent from comparing FIGS. 12 and 13 with FIGS. 6, 7, and 8. FIG. 12 is a graph representing the output of the FIG. 2 circuit (with resistor $R_c$ implemented as in FIGS. 9–10) as a function of time, in response to a square wave input potential Vin (having period 100 nsec), for each of three values of stray capacitance due to three values of the thickness of field oxide layer 113 on which resistor $R_c$ is formed. FIG. 13 is an enlarged detail of a portion of each of the three curves of FIG. 12.

Curve 51 of FIG. 12 assumes that field oxide layer 113 has a typical thickness (9500 angstroms). Curve 50 of FIG. 12 assumes that the field oxide layer has 67% of the typical thickness, and curve 52 of FIG. 12 assumes that the field oxide layer has thickness equal to 200% of the typical thickness.

Because the FIG. 9–10 implementation of resistor $R_c$ of FIG. 2 (which results in the FIG. 12 curves) employs bootstrapping (each of several portions of the resistor comprises an area of N-type semiconductor material coupled to output node Vout, under an area of polysilicon, with a volume of field oxide therebetween) using multiple N-type tubs (having less total area than the area of the large single N-type tub of FIGS. 3–4), the effect of resistor $R_c$'s stray capacitance over the field oxide layer is reduced, causing the leading and trailing edges of each of curves 50, 51, and 52 of FIG. 12 to have shorter rise and fall times than do the corresponding edges of curves 30, 31, and 32 of FIG. 6. The rise time of each curve 50, 51, and 52 is about 4.7 ns, and the fall time of each is about 4.8 ns. Also, as best seen by comparing FIG. 13 with FIG. 7 (and FIG. 12 with FIG. 8), the slope (and overshoot) of the leading and trailing edges of curves 50, 51, and 52 of FIGS. 12 and 13 desirably exhibit much less dependence on the thickness of the field oxide layer on which the polysilicon resistor strips are deposited than do curves 40, 41, and 42 of FIG. 8 or curves 30, 31, and 32 of FIGS. 6–7. As apparent from FIG. 13, the overshoot value of each of curves 50, 51, and 52 (the amount by which the maximum value of the curve exceeds the upper plateau to which each cycle of the curve settles) is so small as to be insignificant, and the leading edge slopes of all three of curves 50, 51, and 52 are substantially the same.

In a variation on the preferred embodiment of the invention described above, an integrated circuit (which implements both an amplifier and a gain-setting resistor) has a substrate of N-type semiconductor material. The inventive resistor is formed over multiple tubs of P-type semiconductor material in the substrate.

Although preferred embodiments of the invention have been described as implementations of a gain-setting resistor $R_c$ coupled to the top rail of a high-speed cascode amplifier (of the type shown in FIG. 1), those of ordinary skill in the art will appreciate that alternative embodiments of the invention include implementations of gain-setting resistors of other high-speed amplifiers (implemented as integrated circuits or portions of integrated circuits) or resistors of integrated circuits which implement functions other than high-speed amplification. In each embodiment of the invention, a resistor comprising multiple, series-connected resistor segments is formed over multiple tubs of semiconductor material of a first polarity (i.e., N-type or P-type material), with the tubs being formed in a semiconductor substrate of the opposite polarity. The resistor has a first end at a first node of fixed or insignificantly varying potential (e.g., the top rail) and a second end at a second node (whose potential varies over a significant range in response to variation of an input signal). The resistor is implemented with multiple bootstrapping in the sense that all tubs are coupled to a third node of the circuit whose potential changes (in response to a change in the input signal) in such a direction as to pull the potential at the resistor's second end in the desired direction. There can be a one-to-one correspondence between tubs and segments (one segment formed over each tub) or there can be more segments than tubs (more than one resistor segment formed over a single one of the tubs, more than one segment formed over each of two or more tubs, or at least one segment having no tub under it). Unless formed over multiple tubs in accordance with the invention, the resistor (which typically, but not necessarily, functions to set the gain of an amplifier) would be subject to the problem of slow response time (due to stray capacitance of its resistor segments over a large volume) and (if implemented with a field oxide layer between the tubs and resistor segments) to the problem of dependence of its response time on the field oxide layer thickness.

Figure 14:
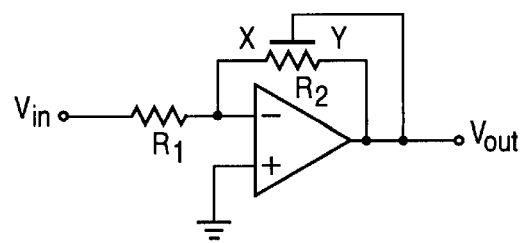
FIG. 14 is a schematic diagram of an inverting amplifier in which resistor R2 is implemented in accordance with the invention.

Other integrated circuit amplifiers in which it is useful include the inventive resistor include inverting amplifiers having operational amplifiers (e.g., the inverting amplifier shown in FIG. 14), and high-speed MOSFET cascode amplifiers. In the inverting amplifier of FIG. 14, resistor R2 (connected between nodes X and Y) is usefully implemented in accordance with the invention, with resistor R2 comprising segments, and the semiconductor tubs underlying the resistor segments being coupled to node Y (at which node the circuit asserts output $V_{out}$). In FIG. 14, node X is a virtual ground, which remains at fixed potential during operation of the amplifier. The gain of the FIG. 14 amplifier is (−R2/R1).

Although only one preferred embodiment has been described in detail (and alternative embodiments have also been described), those having ordinary skill in the art will appreciate that many modifications are possible without departing from the teachings set forth herein. All such modifications are intended to be encompassed within the following claims.

What is claimed is:

1. An integrated circuit configured to assert a first potential at a first node and a second potential at a second node in response to an input signal, wherein each of the first potential and the second potential changes in response to changes in the input signal, said circuit comprising:

a substrate of semiconductor material of a first polarity; and a resistor, wherein the resistor comprises at least two tubs of semiconductor material of a second polarity formed in the substrate, wherein the second polarity is opposite to the first polarity; and multiple resistor segments connected in series between the second node and a third node, wherein each of the segments overlies at least a portion of one of the tubs, and each of the tubs is coupled to the first node such that the first node asserts the first potential to the tubs thereby bootstrapping the second node toward a desired value of the second potential in response to each change in the input signal.

2. The integrated circuit of claim 1, wherein the semiconductor material of the first polarity is P-type semiconductor material, and the semiconductor material of the second polarity is N-type semiconductor material.

3. The integrated circuit of claim 1, also including:

a field oxide layer which overlies the tubs and the substrate and underlies the resistor segments.

4. The integrated circuit of claim 3, wherein said integrated circuit is an amplifier having an output node, and the first node is said output node.

5. The integrated circuit of claim 4, wherein the amplifier has a top rail, and the third node is said top rail.

6. The integrated circuit of claim 3, wherein each of the segments overlies a different one of the tubs, with the field oxide layer between each of the segments and each of the tubs.

7. The integrated circuit of claim 6, wherein the third node is at a potential which is at least substantially fixed, the tub area underlying each of the segments increases from segment to segment with increasing distance along the resistor from the third node.

8. The integrated circuit of claim 7, wherein the separation between tub areas which underlie adjacent ones of the segments decreases with increasing distance along the resistor from the third node.

9. The integrated circuit of claim 3, wherein there are N of the segments and M of the tubs, where N and M are integers and N is greater than M, and at least two of the segments overlie different portions of a single one of the tubs, with the field oxide layer between said at least two of the segments and said one of the tubs.

10. The integrated circuit of claim 3, also including at least one additional resistor segment connected between the third node and a fourth node, wherein the at least one additional resistor segment overlies the substrate rather than any of the tubs, with the field oxide layer between said at least one additional resistor segment and the substrate.

11. The integrated circuit of claim 3, wherein the third node is at a potential which is at least substantially fixed, the tub area underlying each of the segments increases from segment to segment with increasing distance along the resistor from the third node.

12. The integrated circuit of claim 11, wherein the separation between tub areas which underlie adjacent ones of the segments decreases with increasing distance along the resistor from the third node.

13. An integrated circuit including an amplifier configured to assert a first potential at an output node and a second potential at a second node in response to an input signal, wherein each of the first potential and the second potential changes in response to changes in the input signal, said circuit comprising:

a substrate of semiconductor material of a first polarity; and a gain-setting resistor, wherein the gain-setting resistor comprises at least two tubs of semiconductor material of a second polarity formed in the substrate, wherein the second polarity is opposite to the first polarity; and multiple resistor segments connected in series between the second node and a third node, wherein each of the segments overlies at least a portion of one of the tubs, and each of the tubs is coupled to the output node such that the output node asserts the first potential to the tubs thereby bootstrapping the second node toward a desired value of the second potential in response to each change in the input signal.

14. The integrated circuit of claim 13, wherein the amplifier is a high-speed cascode amplifier having a top rail and a bottom rail, and the third node is the top rail.

15. The integrated circuit of claim 14, wherein the semiconductor material of the first polarity is P-type semiconductor material, and the semiconductor material of the second polarity is N-type semiconductor material.

16. The integrated circuit of claim 15, also including:

a field oxide layer which overlies the tubs and the substrate and underlies the resistor segments.

17. The integrated circuit of claim 16, wherein each of the segments overlies a different one of the tubs, with the field oxide layer between each of the segments and each of the tubs.

18. The integrated circuit of claim 16, wherein the tub area underlying each of the segments increases from segment to segment with increasing distance along the resistor from the third node.

19. The integrated circuit of claim 18, wherein the separation between tub areas which underlie adjacent ones of the segments decreases with increasing distance along the resistor from the third node.

20. The integrated circuit of claim 16, wherein there are N of the segments and M of the tubs, where N and M are integers and N is greater than M, and at least two of the segments overlie different portions of a single one of the tubs, with the field oxide layer between said at least two of the segments and said one of the tubs.

21. The integrated circuit of claim 20, wherein N is ten and M is three.

22. The integrated circuit of claim 16, wherein the tub area underlying each of the segments increases from segment to segment with increasing distance along the gain-setting resistor from the third node.

23. The integrated circuit of claim 22, wherein the separation between tub areas which underlie adjacent ones of the segments decreases with increasing distance along the gain-setting resistor from the third node.

24. The integrated circuit of claim 16, wherein each of the resistor segments is a strip of polysilicon.

25. The integrated circuit of claim 13, wherein the amplifier is a high-speed cascode amplifier having a top rail and a bottom rail, and wherein the circuit also includes:

a field oxide layer which overlies the tubs and the substrate and underlies the resistor segments; and at least one additional resistor segment connected between the third node and the top rail, wherein the at least one additional resistor segment overlies the substrate rather than any of the tubs, with the field oxide layer between said at least one additional resistor segment and the substrate.

* * * * *

UNITED STATES PATENT AND TRADEMARK OFFICE
CERTIFICATE OF CORRECTION

PATENT NO.: 5,977,610
DATED: November 2, 1999
INVENTOR(S): Hon Kin Chiu

It is certified that an error appears in the above-identified patent and that said Letters Patent is hereby corrected as shown below:

On the Cover Page, at [73] delete "National Semniconductor Corporation" and replace with --National Semiconductor Corporation--.

Signed and Sealed this

Fifteenth Day of August, 2000

Attest:

Q. TODD DICKINSON

Attesting Officer                                   Director of Patents and Trademarks